(12) United States Patent
Koo et al.

(10) Patent No.: US 8,633,771 B2
(45) Date of Patent: Jan. 21, 2014

(54) POWER AMPLIFIER

(75) Inventors: Bon Hoon Koo, Daejeon (KR); Byeong Hak Jo, Gyunggi-do (KR); Ki Yong Son, Daejeon (KR); Yoo Sam Na, Seoul (KR); Song Cheol Hong, Daejeon (KR)

(73) Assignees: Samsung Electro-Mechanics Co., Ltd., Suwon (KR); Korea Advanced Institute of Science and Technology, Daejeon (KR)

( * ) Notice: Subject to any disclaimer, the term of this patent is extended or adjusted under 35 U.S.C. 154(b) by 1 day.

(21) Appl. No.: 13/272,882

(22) Filed: Oct. 13, 2011

(65) Prior Publication Data
US 2012/0286877 A1    Nov. 15, 2012

(30) Foreign Application Priority Data
May 9, 2011   (KR) .................. 10-2011-0043489

(51) Int. Cl.
*H03F 1/22*   (2006.01)
*H03F 3/04*   (2006.01)

(52) U.S. Cl.
USPC ............................. 330/296; 330/301; 330/311

(58) Field of Classification Search
USPC .................. 330/301, 311, 252–261, 296, 285
See application file for complete search history.

(56) References Cited

U.S. PATENT DOCUMENTS 6,636,119 B2 * 10/2003 Vathulya ........................ 330/311
7,714,664 B2 *  5/2010 Kanaya et al. ................. 330/311

FOREIGN PATENT DOCUMENTS

KR    10-2008-0061480 A    7/2008

\* cited by examiner

*Primary Examiner* — Hieu Nguyen
(74) *Attorney, Agent, or Firm* — McDermott Will & Emery LLP

(57) ABSTRACT

There is provided a power amplifier including an amplifying unit having at least two cascode amplifiers connected in parallel to amplify an input signal; and a bias supply unit supplying bias power to a common gate node of the two cascode amplifiers, and removing a signal of a pre-set frequency band corresponding to a baseband at the common gate node by controlling impedance of the common gate node.

10 Claims, 6 Drawing Sheets

POWER AMPLIFIER

CROSS-REFERENCE TO RELATED APPLICATIONS

This application claims the priority of Korean Patent Application No. 10-2011-0043489 filed on May 9, 2011, in the Korean Intellectual Property Office, the disclosure of which is incorporated herein by reference.

BACKGROUND OF THE INVENTION

1. Field of the Invention

The present invention relates to a power amplifier.

2. Description of the Related Art

Recently, blocks constituting a wireless transceiver have been implemented by using a complementary metal oxide semiconductor (CMOS) process technique and tend to be integrated into a single chip. However, among the blocks of the wireless transceiver, only a power amplifier is implemented by using an indium gallium phosphide (InGaP)/gallium arsenide (GaAs) heterojunction bipolar transistor (HBT) process. Compared with the CMOS process, the InGaP/GaAs HBT process incurs high manufacturing costs, is required to have a multi-chip structure, and has difficulty in being coupled to a control circuit block implemented according to the CMOS process to improve linearity. For these reasons, research into a power amplifier based on the CMOS process has been actively ongoing.

Recently, in a case of employing a power amplifier based on the CMOS process in a commonly used wireless communications terminal, a power amplifier having a cascode structure in which two transistors are stacked due to low breakdown voltage characteristics of a CMOS element compared with the case in which the foregoing HBT process is employed, and bias power is supplied to the power amplifier for an amplifying operation.

The bias power is supplied to a common source amplifier in the cascode structure, and in this case, voltage can be applied to a common gate by using a virtual ground formed by connecting both ends of the common gate obtained by the differential structure. In general, an RF open state is equivalently formed by inserting a large resistor at a bias line of the common gate terminal, and here, a signal detected from the common gate node includes a signal of a frequency band corresponding to a baseband generated due to nonlinear characteristics of the common source amplifier, which reduce the linearity of the amplifier.

SUMMARY OF THE INVENTION

An aspect of the present invention provides a power amplifier having a bias circuit capable of removing a signal of a frequency band corresponding to a baseband from bias power supplied to a common gate node of a cascode structure.

According to an aspect of the present invention, there is provided a power amplifier including: an amplifying unit having at least two cascode amplifiers connected in parallel to amplify an input signal; and a bias supply unit supplying bias power to a common gate node of the two cascode amplifiers, and removing a signal of a pre-set frequency band corresponding to a baseband at the common gate node by controlling impedance of the common gate node.

The bias supply unit may control an impedance of harmonic components of the common gate node according to an inductance component of a bonding wire connected to a ground.

The bias supply unit may include: first and second resistors dividing a voltage level of the bias power according to a pre-set resistance ratio and a first capacitor connected to be parallel to the first resistor, wherein one end of the first resistor may be connected to the ground and the other end thereof may be connected to the common gate node, and one end of the second resistor may be connected to a bias power terminal to receive the bias power and the other end thereof may be connected along with the other end of the first resistor to the common gate node to transfer the divided bias power to the common gate node.

The one end of the first resistor may be connected to the ground through a first bonding wire, and the one end of the second resistor may be connected to the bias power terminal through a second bonding wire.

The bias supply unit may further include: a switch connected in series between the other end of the first resistor and the other end of the second resistor, turned on in a high power mode having a pre-set power range, and turned off in a low power mode, having a power range lower than that of the high power mode.

The bias supply unit may include: a first diode having a cathode connected to the common gate node; and a second diode having an anode connected to the ground and a cathode connected to the common gate node along with the cathode of the first diode, the cathode being connected to the bias power terminal to receive the bias power and transfer the received bias power to the common gate node.

The anode of the second diode may be connected to the ground through the first bonding wire and the cathode of the second diode may be connected to the bias power terminal through the second bonding wire.

The power amplifier may further include an impedance matching unit matching impedance between a signal amplified by the amplifying unit and an output terminal.

The power amplifier may further include a balloon converting an input single signal into a balance signal and transferring the converted balance signal to the amplifying unit as the input signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
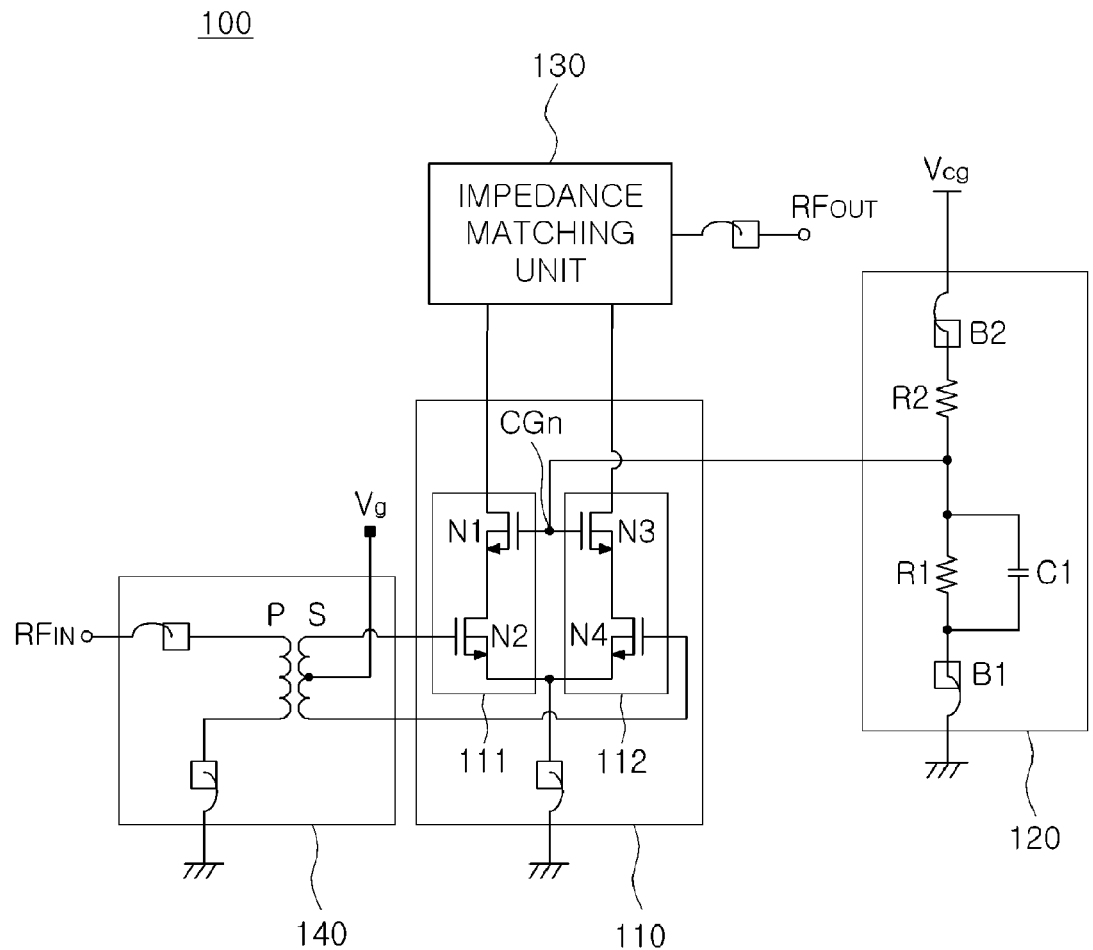
FIG. 1 is a schematic view showing the configuration of a power amplifier according to an embodiment of the present invention.

Embodiments of the present invention will now be described in detail with reference to the accompanying drawings such that they could be easily practiced by those having skill in the art to which the present invention pertains. However, in describing the embodiments of the present invention, detailed descriptions of well-known functions or constructions will be omitted so as not to obscure the description of the present invention with unnecessary detail.

In addition, like reference numerals denote like elements throughout the drawings.

Unless explicitly described to the contrary, the word "comprise" and variations such as "comprises" or "comprising," will be understood to imply the inclusion of stated elements but not the exclusion of other elements.

FIG. 1 is a schematic view showing the configuration of a power amplifier according to an embodiment of the present invention.

With reference to FIG. 1, a power amplifier 100 according to an embodiment of the present invention may include an amplifying unit 110 and a bias supply unit 120. In addition, the power amplifier 100 according to an embodiment of the present invention may further include an impedance matching unit 130 and a balloon 140. The power amplifier 100 may be implemented through a CMOS process.

The amplifying unit 110 may amplify an input signal according to a pre-set gain. To this end, the amplifying unit 110 may include at least two cascode amplifiers 111 and 112.

Each of the first and second cascode amplifiers 111 and 112 may include two NMOS FETs (n-type metal-oxide-semiconductor field-effect transistors) N1, N2, N3, and N4 which are connected in series, respectively. The first and second cascode amplifiers 111 and 112 may be connected in parallel.

Namely, the first and second NMOS FETs N1 and N2 may be connected in series to configure the first cascode amplifier 111, and the third and fourth NMOS FETs N3 and N4 may be connected in series to configure the second cascode amplifier 112.

A gate of the first NMOS FET N1 and that of the third NMOS FET N3 may be provided as a common gate to which the gates of both NMOS FETs N1 and N3 are commonly connected, and a source of the second NMOS FET N2 and that of the fourth NMOS FET N4 may be provided as a common source which is commonly connected.

An input signal desired to be amplified may be transferred to a gate of the second NMOS FET N2 and that of the fourth NMOS FET N4. A source of the first NMOS FET N1 and a drain of the second NMOS FET N2 may be connected, and a source of the third NMOS FET N3 and a drain of the fourth NMOS FET N4 may be connected, and drains of the first and third NMOS FETs N1 and N3 may output an amplified signal.

A signal amplifying operation of the first and second cascode amplifiers 111 and 112 is technical content widely known to a skilled person in the art, so a description thereof will be omitted.

The bias supply unit 120 may supply received bias power Vcg to the amplifying unit 110. In detail, the bias supply unit 120 may supply the bias power Vcg to a common gate node CGn, i.e., a node to which the gate of the first NMOS FET N1 of the first cascode amplifier 111 and that of the third NMOS FET N3 of the second cascode amplifier 112 are commonly connected.

An embodiment of the bias supply unit 120 employed in the power amplifier 100 according to an embodiment of the present invention may include first and second resistors R1 and R2 dividing the bias power Vcg. The first and second resistors R1 and R2 may be connected in series between a bias power terminal supplying the bias power Vcg and a ground. A first capacitor C1 may be connected in parallel to the first resistor R1. One end of the first resistor R1 may be connected to the ground, and the other end of the first resistor R1 may be connected together with the other end of the second resistor R2 to the common gate node CGn. One end of the second resistor R2 may be connected to the bias power terminal.

Here, the one end of the first resistor R1 may be connected to the ground through a first bonding wire B1, and the one end of the second resistor R2 may be connected to the bias power terminal through a second bonding wire B2.

The first bonding wire B1 and the second bonding wire B2 may be configured as a conductor, respectively, and may have an inductance component according to the length of the conductors. Thus, impedance at the common gate node CGn can be controlled by the inductance component of the first bonding wire B1 and a capacitance component of the first capacitor C1. A harmonic component of a signal generated at the intended common gate node CGn can be removed by controlling the impedance, and accordingly, a frequency signal of a frequency band similar to a baseband signal provided after processing the input signal can be removed.

The frequency band of the baseband signal is different for every wireless communications system, but generally, it may be about 4 MHz, 5 MHz, or 6 MHz. As the input RF signal is amplified by the cascode amplifier, a harmonic component of an approximately ±5 MHz band corresponding to the frequency band of a baseband signal may be generated at the frequency band of the input signal at the common gate node CGn. Here, since the frequency signal of the corresponding band is required to be removed, the impedance is controlled at the common gate node CGn, thus removing the signal of the corresponding frequency band. The foregoing bias supply unit may be implemented to have various configurations, and some of implementable configurations of the bias supply unit will now be described in detail with reference to FIGS. 2 and 3, but the present invention is not limited thereto.

With reference back to FIG. 1, the impedance matching unit 130 may match impedance at a signal path between an output terminal of the amplifying unit 110 and an output terminal RFout of the power amplifier 100, with a pre-set value.

The balloon 140 may include a primary winding P and a secondary winding S. The balloon 140 may convert a single signal RFin into a balance signal and provide the converted balance signal as an input signal to the amplifying unit 110.

Figure 2:
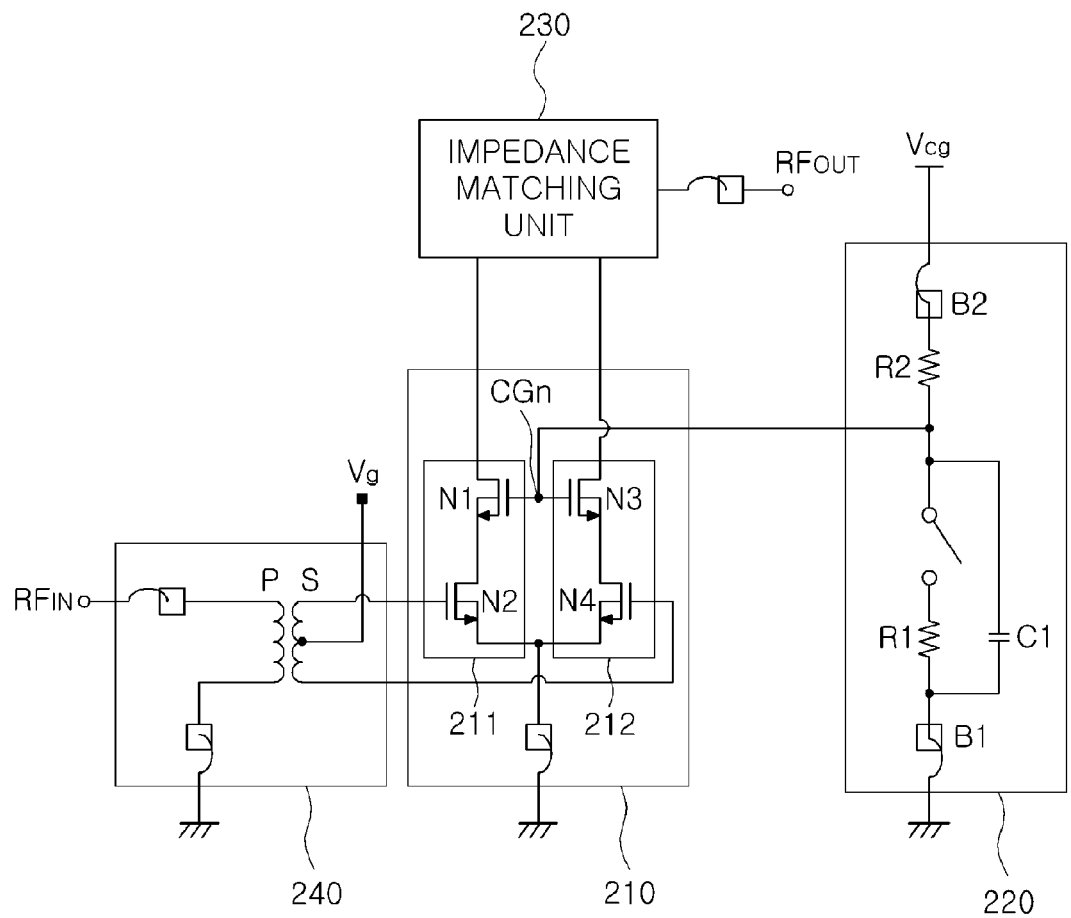
FIG. 2 is a schematic view showing the configuration of a power amplifier according to another embodiment of the present invention.

FIG. 2 is a schematic view showing the configuration of a power amplifier according to another embodiment of the present invention.

With reference to FIG. 2, a power amplifier 200 according to another embodiment of the present invention may include an amplifying unit 210, an impedance matching unit 230, and a balloon 240 having the same constituents as those of the amplifying unit 110, the impedance matching unit 130, and the balloon 140 of the power amplifier 100 according to one embodiment of the present invention as illustrated in FIG. 1. A detailed description thereof will be omitted.

Meanwhile, the configuration of a bias supply unit 220 may be different from the bias supply unit 120 of the power amplifier 100 according to one embodiment of the present invention illustrated in FIG. 1.

Namely, the bias supply unit 220 may include first and second resistors R1 and R2 dividing the bias power Vcg, and a first capacitor C1 connected in parallel to the first resistor R1. One end of the first resistor R1 may be connected to a ground through the first bonding wire B1, and one end of the second resistor R2 may be connected to the bias power terminal through the second bonding wire B2. In addition, the bias supply unit 220 may further include a switch S connected between the other end of the first resistor R1 and the other end of the second resistor R2.

The switch S may be turned on to increase linearity in a high power mode in which an input signal is amplified to have a high power level according to a control signal from the exterior. Thus, impedance at the common gate node CGn can be controlled by the inductance component of the first bonding wire B1 and the capacitance component of the first capacitor C1. A harmonic component of a signal generated at the intended common gate node CGn can be removed by controlling the impedance, and accordingly, a frequency signal of a frequency band similar to a baseband signal provided after processing the input signal can be removed. Conversely, in a low power mode in which an input signal is amplified to have a low power level, the switch S is turned off to prevent consumption of a quiescent current.

Figure 3:
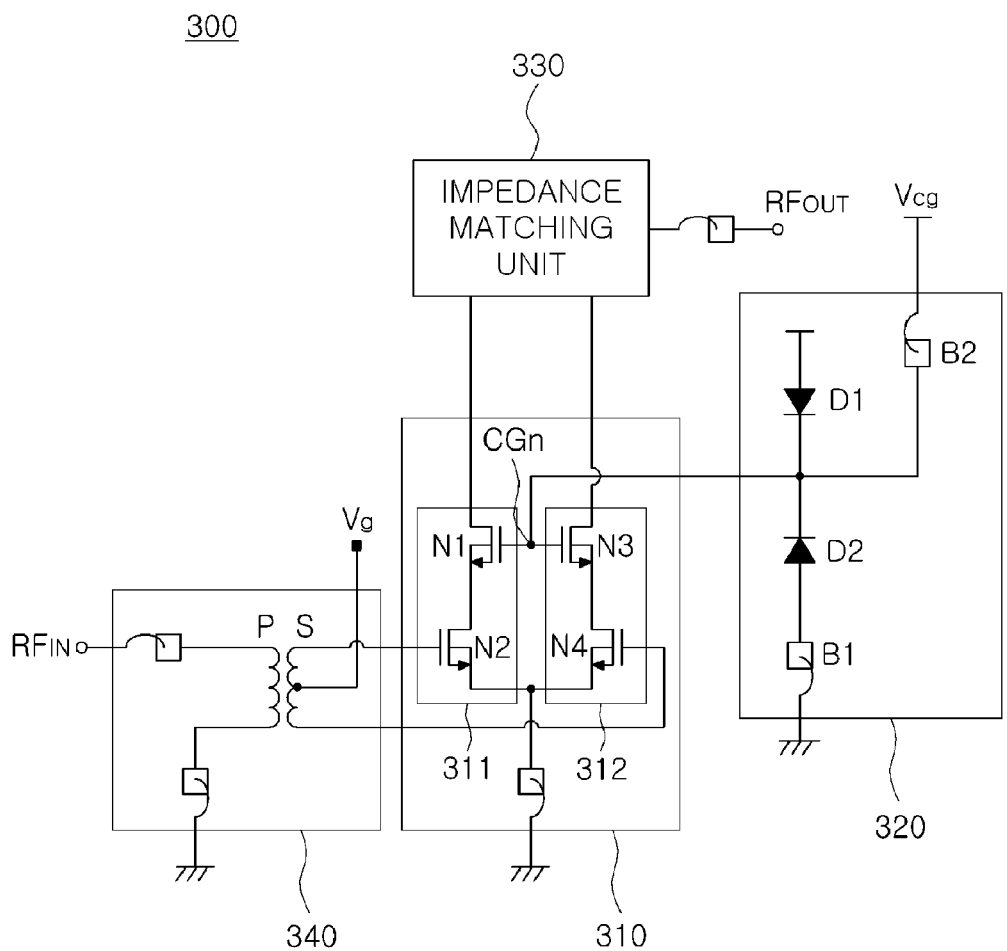
FIG. 3 is a schematic view showing the configuration of a power amplifier according to another embodiment of the present invention.

FIG. 3 is a schematic view showing the configuration of a power amplifier according to another embodiment of the present invention.

With reference to FIG. 3, a power amplifier 300 according to another embodiment of the present invention may include an amplifying unit 310, an impedance matching unit 330, and a balloon 340 which have the same constituents as those of the amplifying unit 110, the impedance matching unit 130, and the balloon 140 of the power amplifier 100 according to one embodiment of the present invention as illustrated in FIG. 1 and as those of the amplifying unit 210, the impedance matching unit 230, and the balloon 240 of the power amplifier 200 according to another embodiment of the present invention as illustrated in FIG. 2. A detailed description thereof will be omitted.

Meanwhile, the configuration of a bias supply unit 320 may be different from the bias supply unit 120 of the power amplifier 100 according to one embodiment of the present invention illustrated in FIG. 1 and the bias supply unit 220 of the power amplifier 200 according to another embodiment of the present invention illustrated in FIG. 2.

Namely, the bias supply unit 320 may include first and second diodes D1 and D2.

A cathode of the first diode D1 and a cathode of the second diode d2 are connected to the common gate node CGn, and the bias power Vcg may be supplied to the common gate node CGn. An anode of the second diode D2 may be connected to a ground through the first bonding wire B1, and the bias power terminal transferring the bias power Vcg may supply the bias power Vcg to the common gate node CGn through the second bonding wire B2. Impedance at the common gate node CGn can be controlled by the inductance component of the first bonding wire B1. A signal generated at the intended common gate node CGn can be removed by controlling the impedance, and a frequency signal of a frequency band similar to a baseband signal provided after processing the input signal can be removed.

Figure 4A:
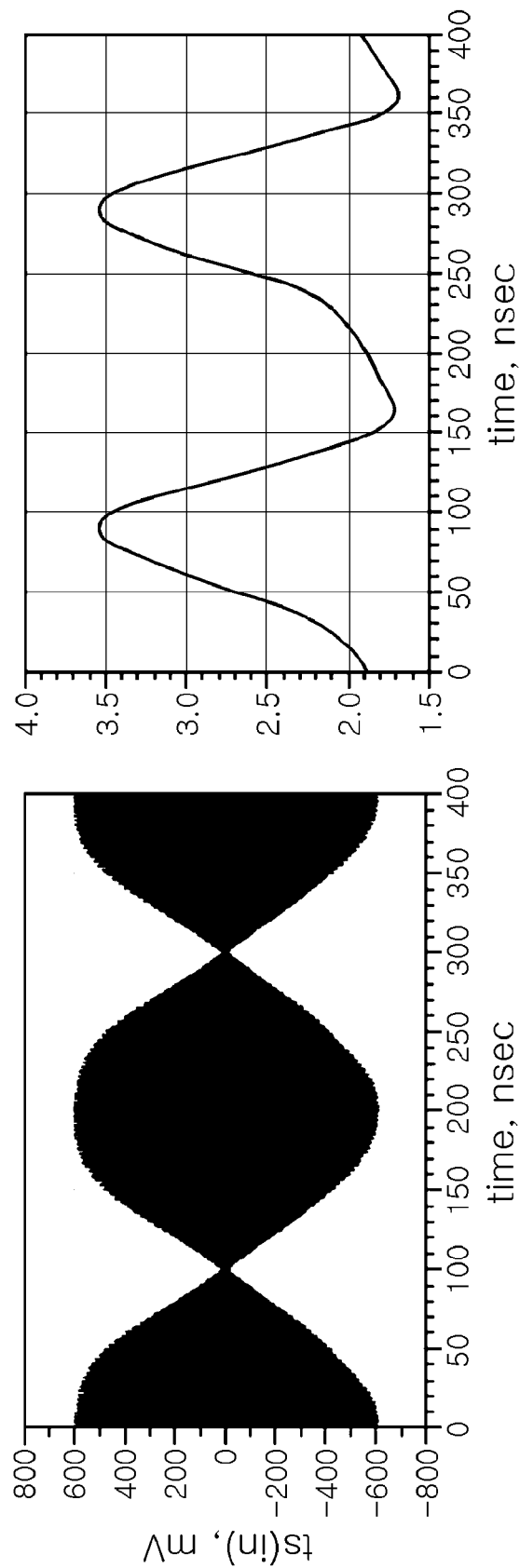
FIG. 4A is a graph showing electrical characteristics of a general power amplifier.
Figure 4B:
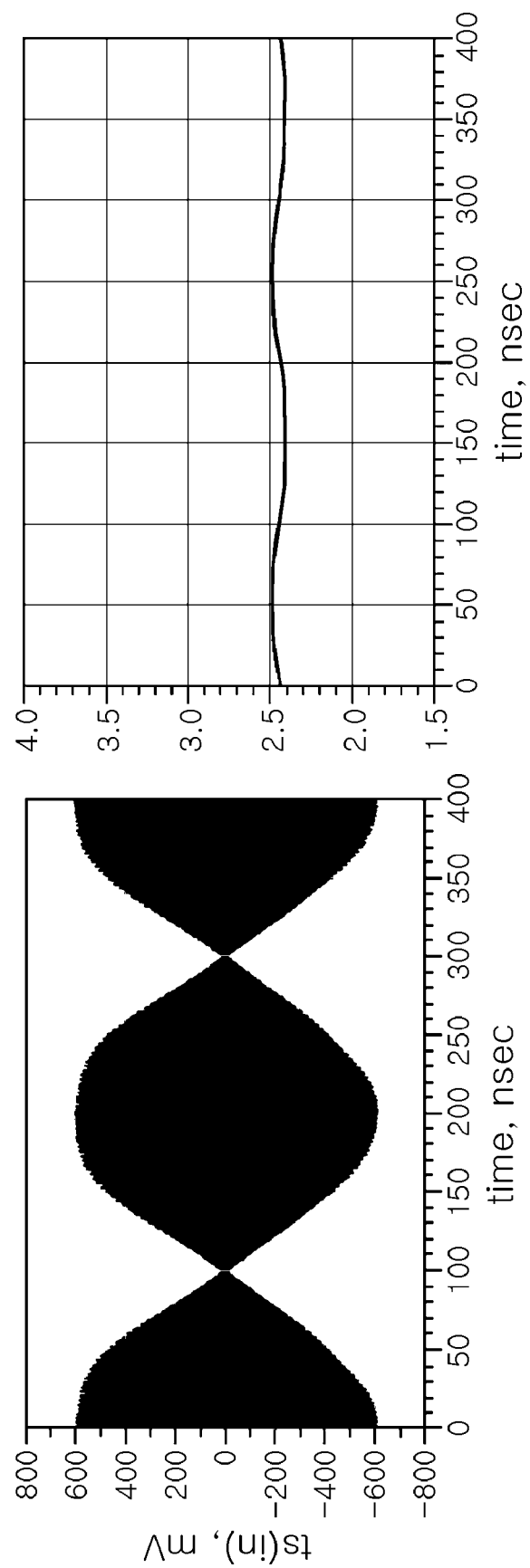
FIG. 4B is a graph showing electrical characteristics of a power amplifier according to an embodiment of the present invention.

FIG. 4A is a graph showing electrical characteristics of a general power amplifier, and FIG. 4B is a graph showing electrical characteristics of a power amplifier according to an embodiment of the present invention.

With reference to FIG. 4A, in case of the general power amplifier, when the input signal RFin is input as shown at the left side, a low frequency signal of the frequency band corresponding to a baseband is generated from the common gate node as shown at the right side.

Meanwhile, with reference to FIG. 4B, in case of the power amplifier according to an embodiment of the present invention, when the input signal RFin is input as shown at the left side, impedance at the common gate node can be controlled by the bonding wire or by both the bonding wire and the capacitor. The low frequency signal of the frequency band corresponding to the baseband has a small value of impedance viewed at the common gate node, so the low frequency signal of the baseband frequency range can be released to a ground. Accordingly, it is noted that the low frequency signal of the frequency band corresponding to the baseband at the common gate node can be removed as shown at the right side of FIG. 4B.

Figure 5:
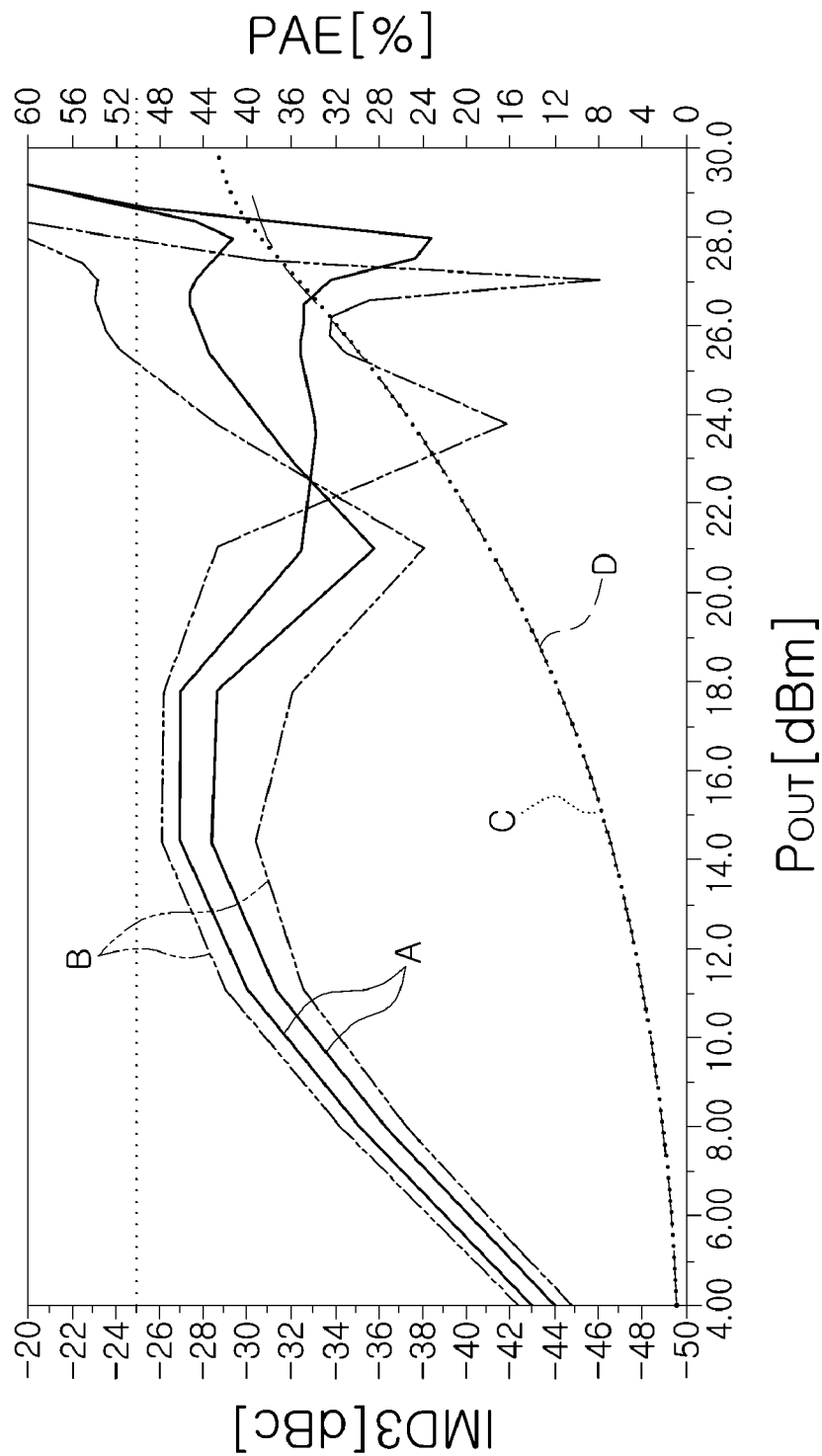
FIG. 5 is a graph showing a comparison between IMD3 and PAE of the general power amplifier and the power amplifier according to an embodiment of the present invention.

FIG. 5 is a graph showing a comparison between IMD3 and PAE of the general power amplifier and the power amplifier according to an embodiment of the present invention.

With reference to FIG. 5, it is noted that, compared with a third-order intermodulation distortion (IMD3) B and power added efficiency (PAE) D of the general power amplifier which does not have such a function of removing a harmonic component of the frequency band corresponding to the baseband at the common gate node, the IMD3 A and the PAE C of the power amplifier according to an embodiment of the present invention are improved because the harmonic component of the frequency band corresponding to the baseband at the common gate node is removed.

As described above, according to an embodiment of the present invention, the signal of the frequency band corresponding to the baseband generated at the common gate node of the cascode amplifier is removed by controlling the impedance at the common gate node, whereby asymmetry between the upper side and lower side of the IMD3 of the power amplifier can be reduced to thus improve the linearity.

As set forth above, according to embodiments of the invention, since a signal of a frequency band corresponding to the baseband generated at the common gate node of the cascode amplifier is removed by controlling impedance of the common gate node, asymmetry and linearity of a side band signal of the power amplifier can be improved.

While the present invention has been shown and described in connection with the embodiments, it will be apparent to those skilled in the art that modifications and variations can be made without departing from the spirit and scope of the invention as defined by the appended claims.

What is claimed is:

1. A power amplifier, comprising:
an amplifying unit having at least two cascode amplifiers connected in parallel to amplify an input signal; and
a bias supply unit supplying bias power to a common gate node of the two cascode amplifiers, and removing a signal of a pre-set frequency band corresponding to a baseband at the common gate node by controlling impedance of the common gate node,
wherein the bias supply unit adjusts an impedance of harmonic components of the common gate node according to an inductance component of a bonding wire connected to a ground,
wherein the bias supply unit includes first and second resistors dividing a voltage level of the bias power according to a pre-set resistance ratio and a first capacitor connected to be parallel to the first resistor,
wherein one end of the first resistor is connected to the ground and the other end thereof is connected to the common gate node, and one end of the second resistor is connected to a bias power terminal to receive the bias power and the other end thereof is connected along with the other end of the first resistor to the common gate node to transfer the divided bias power to the common gate node,
wherein the bias supply unit includes a switch connected in series between the other end of the first resistor and the other end of the second resistor, turned on in a high power mode having a pre-set power range, and turned off in a low power mode, having a power range lower than that of the high power mode.

2. The power amplifier of claim 1, wherein the anode of the second diode is connected to the ground through the first bonding wire and the cathode of the second diode is connected to the bias power terminal through the second bonding wire.

3. The power amplifier of claim 1, further comprising an impedance matching unit matching impedance between a signal amplified by the amplifying unit and an output terminal.

4. The power amplifier of claim 1, further comprising a balloon converting an input single signal into a balance signal and transferring the converted balance signal to the amplifying unit as the input signal.

5. A power amplifier, comprising:
an amplifying unit having at least two cascode amplifiers connected in parallel to amplify an input signal; and
a bias supply unit supplying bias power to a common gate node of the two cascode amplifiers, and removing a signal of a pre-set frequency band corresponding to a baseband at the common gate node by controlling impedance of the common gate node,
wherein the bias supply unit adjusts an impedance of harmonic components of the common gate node according to an inductance component of a bonding wire connected to a ground,
wherein the bias supply unit includes:
a first diode having a cathode connected to the common gate node; and
a second diode having an anode connected to the ground and a cathode connected to the common gate node along with the cathode of the first diode, the cathode being connected to the bias power terminal to receive the bias power and transfer the received bias power to the common gate node.

6. The power amplifier of claim 1, wherein the one end of the first resistor is connected to the ground through a first bonding wire, and the one end of the second resistor is connected to the bias power terminal through a second bonding wire.

7. The power amplifier of claim 5, further comprising an impedance matching unit matching impedance between a signal amplified by the amplifying unit and an output terminal.

8. The power amplifier of claim 5, further comprising a balloon converting an input single signal into a balance signal and transferring the converted balance signal to the amplifying unit as the input signal.

9. The power amplifier of claim 5,
wherein the bias supply unit includes first and second resistors dividing a voltage level of the bias power according to a pre-set resistance ratio and a first capacitor connected to be parallel to the first resistor,
wherein one end of the first resistor is connected to the ground and the other end thereof is connected to the common gate node, and one end of the second resistor is connected to a bias power terminal to receive the bias power and the other end thereof is connected along with the other end of the first resistor to the common gate node to transfer the divided bias power to the common gate node.

10. The power amplifier of claim 9, wherein the one end of the first resistor is connected to the ground through a first bonding wire, and the one end of the second resistor is connected to the bias power terminal through a second bonding wire.

* * * * *